United States Patent
Lee et al.

(10) Patent No.: US 9,257,679 B2
(45) Date of Patent: Feb. 9, 2016

(54) MANUFACTURING METHOD FOR FLEXIBLE DISPLAY DEVICE

(71) Applicants: Hong-Ro Lee, Yongin (KR); Chang-Mo Park, Yongin (KR); Yo-Sub Ko, Yongin (KR)

(72) Inventors: Hong-Ro Lee, Yongin (KR); Chang-Mo Park, Yongin (KR); Yo-Sub Ko, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 261 days.

(21) Appl. No.: 13/949,872

(22) Filed: Jul. 24, 2013

(65) Prior Publication Data

US 2014/0295586 A1    Oct. 2, 2014

(30) Foreign Application Priority Data

Mar. 26, 2013 (KR) .................. 10-2013-0032247

(51) Int. Cl.
*H01L 21/02* (2006.01)
*H01L 51/56* (2006.01)
*H01L 51/00* (2006.01)

(52) U.S. Cl.
CPC .............. *H01L 51/56* (2013.01); *H01L 51/003* (2013.01); *H01L 2251/5338* (2013.01)

(58) Field of Classification Search
None
See application file for complete search history.

(56) References Cited

U.S. PATENT DOCUMENTS

2014/0256206 A1*   9/2014   Kim ................................ 445/24

FOREIGN PATENT DOCUMENTS

| KR | 10-0890250 B1 | 3/2009 |
|---|---|---|
| KR | 10-1168685 B1 | 7/2012 |

* cited by examiner

*Primary Examiner* — Seahvosh Nikmanesh
(74) *Attorney, Agent, or Firm* — Lee & Morse, P.C.

(57) ABSTRACT

A method of manufacturing a flexible display device, the method including depositing a separation layer on a supporting substrate; depositing a display panel on the separation layer; cutting the display panel to have a predetermined shape; cutting the supporting substrate and the separation layer to have a wider area than an area where the display panel, that is cut with the predetermined shape, contacts the supporting substrate and the separate layer; and separating the separate layer and the display panel from each other.

17 Claims, 9 Drawing Sheets

MANUFACTURING METHOD FOR FLEXIBLE DISPLAY DEVICE

CROSS-REFERENCE TO RELATED APPLICATION

Korean Patent Application No. 10-2013-0032247 filed on Mar. 26, 2013, in the Korean Intellectual Property Office, and entitled: "MANUFACTURING METHOD FOR FLEXIBLE DISPLAY DEVICE," is incorporated by reference herein in its entirety.

BACKGROUND

1. Field

Embodiments relate to a manufacturing method for a flexible display device.

2. Description of the Related Art

In recent years, flexible displays having a lightweight and shock-resistant flexible substrate made of a material such as plastic have been considered. Such a flexible display may be maximized in portability since it can be folded or rolled up, and may be applied in various fields.

A flexible display may include a display element on a flexible substrate. Display elements that can be used for a flexible display may include, e.g., an organic light emitting diode display device, a liquid crystal display device, and an electrophoretic display (EPD) device.

These display elements may include thin film transistors. Thus, in order to form a flexible display, the flexible substrate may undergo a number of thin film processes.

Also, the flexible substrate may be encapsulated through a thin film process by an encapsulation substrate. The flexible substrate, the thin film transistor on the flexible substrate, and the encapsulation substrate may form a display panel of the flexible display device.

The above information disclosed in this Background section is only for enhancement of understanding of the background of the invention and therefore it may contain information that does not form the prior art that is already known in this country to a person of ordinary skill in the art.

SUMMARY

The embodiments provide a manufacturing method of a flexible display device that helps to prevent breakage or damage in a process of separating a flexible substrate and a display panel from a supporting substrate.

A manufacturing method of a flexible display device according to an exemplary embodiment includes: depositing a separate layer on a supporting substrate; depositing a display panel on the separate layer; cutting the display panel to have a predetermined shape; cutting the supporting substrate and the separate layer to have a wider area than an area where the display panel that is cut with the predetermined shape contacts the supporting substrate and the separate layer; and separating the separate layer and the display panel from each other.

The display panel may be cut from an upper side of the display panel in a lower direction in the cutting of the display panel, and the supporting substrate and the separate layer may be cut from the lower side of the supporting substrate in an upper direction in the cutting of the supporting substrate and the separate layer.

The display panel may be cut with a square shape, and the separate layer and the supporting substrate may be cut with a square shape corresponding to the display panel with the square shape.

At least one first incision surface of the display panel of the square shape and a first incision surface of the separate layer and the supporting substrate corresponding to the first incision surface may be formed to be stepped.

The incision surface except for at least one first incision surface of the display panel may be parallel to the incision surface except for the first incision surface of the separate layer and the supporting substrate.

Before the separating of the separate layer and the display panel, the method further includes separating the display panel, the supporting substrate, and the separate layer around the display panel, the supporting substrate, and the separate layer that are cut with the predetermined shape from the display panel, the supporting substrate, and the separate layer that are cut with the predetermined shape.

The separating of the separate layer and the display panel may include peeling between a side end of the first incision surface of the display panel and the separate layer that are stepped.

In the peeling of the side end of the first incision surface of the display panel and the separate layer that are stepped, the side end of the first incision surface of the display panel and the separate layer that are stepped may be physically peeled by inserting a peeling means between the side end of the first incision surface of the display panel and the separate layer that are stepped.

The peeling means may be formed of a thin plate shape having a width corresponding to a width of the display panel.

After peeling the side end of the first incision surface and the separate layer, the display panel and the separate layer, may be separated from each other by relatively moving the side end of the first incision surface of the display panel and the separate layer in a direction away from each other.

The separating of the display panel, and the separate layer and the supporting substrate, may include: respectively fixing a lower surface of the supporting substrate and an upper surface of the display panel to first and second fixing parts that are separated from each other; and operating the first and the second fixing parts to gradually separate the separate layer from the side end of the first incision surface of the peeled display panel in a state in which the lower surface of the supporting substrate and the upper surface of the display panel are respectively fixed to the first and second fixing parts.

The first fixing part may include a first conveyor belt extended in a horizontal direction, and the second fixing part may include a second conveyor belt having a portion that is extended in the horizontal direction and the remaining portion is extended in an inclined direction.

A separation distance in the horizontal direction between the first incision surface of the display panel and the first incision surface of the separate layer may be in a range of 0.5-3 mm.

The separate layer may be formed of aluminum zinc oxide (AZO).

A thickness of the separate layer may be in a range of 50 Å-300 Å.

Surface roughness of the separate layer may be in a range of 6 Å-15 Å.

The display panel may include a display substrate positioned on the separate layer, an organic light emitting element positioned on the display substrate, and a thin film encapsulation layer covering the organic light emitting element.

DETAILED DESCRIPTION

Figure 1:
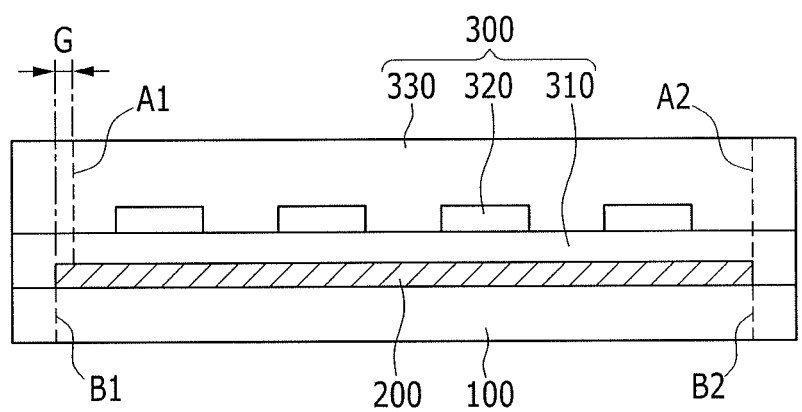
FIG. 1 illustrates a cross-sectional view of a flexible display device taken along a cutting line in a manufacturing method of a flexible display device according to an exemplary embodiment.

Hereinafter, exemplary embodiments will be described in detail with reference to the accompanying drawings so that those skilled in the art can realize the embodiments. As those skilled in the art would realize, the described embodiments may be modified in various different ways, all without departing from the spirit or scope of the embodiments. The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the embodiments are not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Furthermore, it will be understood throughout the specification that when an element is referred to as being "on" another element, it may be placed over or below the other element but is not necessarily placed over the other element, based on the direction of gravity.

Next, a manufacturing method of a flexible display device according to an exemplary embodiment will be described with reference to FIG. 1 to FIG. 7.

FIG. 1 illustrates a cross-sectional view of a flexible display device taken along a cutting line in a manufacturing method of a flexible display device according to an exemplary embodiment. FIG. 2 to FIG. 7 illustrate views sequentially showing a manufacturing method of a flexible display device according to an exemplary embodiment.

Referring to FIG. 1, in a manufacturing method of a flexible display device according to an exemplary embodiment, a separation layer 200 may be formed on a supporting substrate 100. As described above, in the flexible display device, a display panel may be positioned on a solid supporting substrate 100 to prevent breakage or damage to the display panel.

Here, the supporting substrate 100 may be made of a glass material. The supporting substrate 100 may have a supporting function while the display panel 300 is formed. When the display panel is completed, the supporting substrate 100 may be removed from the display panel 300.

Also, the separation layer 200 may be formed on the supporting substrate 100, and then a display panel 300, e.g., a display substrate 310, may be positioned on the separation layer 200.

Referring to FIG. 1, the separation layer 200 may be positioned between the supporting substrate 100 and the display panel 300 such that the display substrate 310 is fixed on the supporting substrate 100 during the manufacturing process.

Also, when the manufacturing process is finished, the separation layer 200 may be easily separated from the supporting substrate 100 and the display panel 300. For this, the separation layer 200 may have a surface roughness of a predetermined magnitude. A detailed description thereof will be provided below.

The separation layer 200 may be made of aluminum zinc oxide (AZO). The separation layer 200 may be formed by depositing the AZO by a sputtering method.

The AZO may include $Al_2O_3$ and ZnO. An amount of $Al_2O_3$ in the AZO may be less than about 3 weight percent (wt %). In an implementation, the amount of $Al_2O_3$ may be about 2 weight percent (wt %).

To easily separate the display panel 300 from the separation layer 200, the separation layer 200 may have the surface roughness of the predetermined magnitude. When the content of $Al_2O_3$ forming the separation layer 200 is increased, the surface roughness of the deposited AZO may be decreased. Accordingly, in an implementation, the content of $Al_2O_3$ may be less than 3 weight percent (wt %).

Also, according to an exemplary embodiment, a deposition temperature of the AZO forming the separation layer 200 may be about 100° C. to about 300° C. In an implementation, the deposition temperature of AZO may be about 200° C. Here, the surface roughness may be increased as the deposition temperature of AZO is increased such that the deposition may be performed at the described deposition temperature to provide the appropriate surface roughness to the separation layer 200.

Meanwhile, according to an exemplary embodiment, a thickness of the separation layer 200 may be about 50 Å to about 300 Å. In an implementation, the deposition thickness of AZO may be about 50 Å to about 300 Å.

The deposition thickness of AZO may affect an inferiority rate of the flexible display device in the manufacturing process of the flexible display device. For example, maintaining the deposition thickness of AZO at about 50 Å or greater may help ensure that damage to the display substrate 310 is prevented, when separating the display substrate 310. Maintaining the deposition thickness of AZO at about 300 Å or less may help prevent an undesirable increase in a number and a size of air traps generated between the display substrate and the supporting substrate, thereby ensuring that that the inferiority rate is not increased.

Also, according to an exemplary embodiment, the surface roughness of the separation layer 200 may be about 6 Å to about 15 Å. Here, the surface roughness is expressed as a root mean square (RMS).

Figure 9:
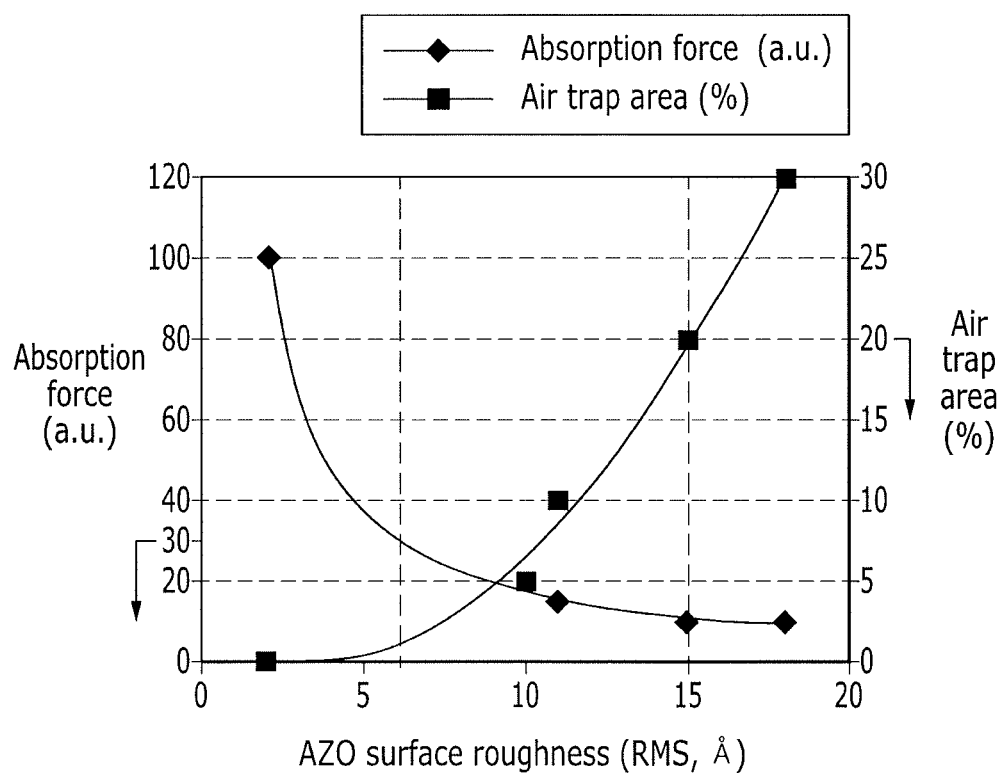
FIG. 9 illustrates measurement results of a change of an absorption force and an air trap area ratio according to surface roughness of a separate layer.

Referring to FIG. 9, the change of the surface roughness and the absorption force of the separation layer may be confirmed. Here, the absorption force means the absorption force between the separation layer 200 and the display substrate 310. As the surface roughness of the separation layer 200 is increased, the absorption force is decreased.

When the absorption force is large, the separation of the separation layer 200 and the display substrate 310 may not be easy. Accordingly, to easily separate the separation layer 200 and the display substrate 310, the absorption force should be less than a predetermined magnitude.

According to an exemplary embodiment, adherence between the separation layer 200 and the display substrate 310 may be less than about 30 (a.u.). For example, the surface roughness of the separation layer 200 may be more than about 6 Å. Here, the unit a.u. (arbitrary unit) of the absorption force means a relative value.

Referring to FIG. 9, the surface roughness of the separation layer and the change of the air trap area ratio of the substrate may be confirmed. As the surface roughness of the separation layer 200 is increased, the air trap area ratio may be increased.

According to an exemplary embodiment, the air trap area ratio may be less than about 20%. For example, the surface roughness of the separation layer 200 may be less than about 15 Å.

Thus, according to an exemplary embodiment, when considering the change of the adherence and the air trap area ratio, the surface roughness of the separation layer 200 may be about 6 Å to about 15 Å.

Next, according to an exemplary embodiment, after forming the separation layer 200, the display panel 300 may be formed on the separation layer 200. The display panel 300 may be a constituent element displaying the image.

As shown in FIG. 1, the display panel 300 may include the display substrate 310 on the separation layer 200, an organic light emitting element 320 on the display substrate 310, and a thin film encapsulation layer 330 covering the organic light emitting element 320.

Hereafter, the display panel 300 of the organic light emitting diode (OLED) display including the organic light emitting element is described. However, the embodiments are not limited thereto, and the display panel may be one such as a liquid crystal display (LCD), a plasma display device (PDP), an electric field effect display (FED) device, and an electrophoretic display device.

Although not shown in the drawings, the organic light emitting element 320 may include an anode electrode, an organic emission layer, and a cathode electrode. The organic emission layer may include organic layers that efficiently transfer carriers of holes or electrons to the emission layer in addition to the emission layer where light is emitted, in practice. The organic layers may include a hole injection layer (HIL) and a hole transport layer (HTL) positioned between the anode and the emission layer, and an electron injection layer (EIL) and an electron transport layer (ETL) positioned between the cathode electrode and the emission layer.

In the organic light emitting element, if a predetermined voltage is applied to the anode electrode and the cathode electrode, holes injected from the anode electrode are moved via the hole transport layer (HTL) forming the emission layer to the emission layer, and electrons injected from the cathode electrode are injected via the electron transport layer (ETL) to the emission layer. In this case, the electrons and the holes are recombined to generate excitons in the emission layer, and the excitons are changed from an exited state to a ground state to allow fluorescent molecules of the emission layer to emit light, thus forming an image. The organic light emitting element 320 is positioned on the display substrate 310, and receives a signal from a wire portion and displays an image by the received signal. A pixel means a minimum unit displaying an image, and the organic light emitting diode (OLED) display displays the image by using a plurality of pixels.

The thin film encapsulation layer 330 may be formed on the organic light emitting element 320 to encapsulate the organic light emitting element 320. Performance of the organic light emitting element 320 may be deteriorated when reacted with moisture or oxygen. Thus, in order to prevent the deterioration, the organic light emitting element 320 may be shielded from the outside through the thin film encapsulation layer 330 to be protected.

The thin film encapsulation layer 330 may be formed of a plurality of layers. The thin film encapsulation layer 330 may include at least one of an inorganic layer and an organic layer, and the inorganic layer and the organic layer may be alternately layered and the alternating may be iterative. The inorganic layer may include, e.g., aluminum oxide or silicon oxide, and the organic layer may include, e.g., epoxy, acrylate, urethane acrylate, or the like.

The inorganic layer may help prevent permeation of moisture or oxygen into the organic light emitting element. The organic layer may function to release internal stress of the inorganic layer or may fill microcracks and pinholes of the inorganic layer. The materials of the inorganic layer and the organic layer are not limited to the above-stated materials, and various types of inorganic and organic layers known to a person skilled in the art may be used.

Figure 2:
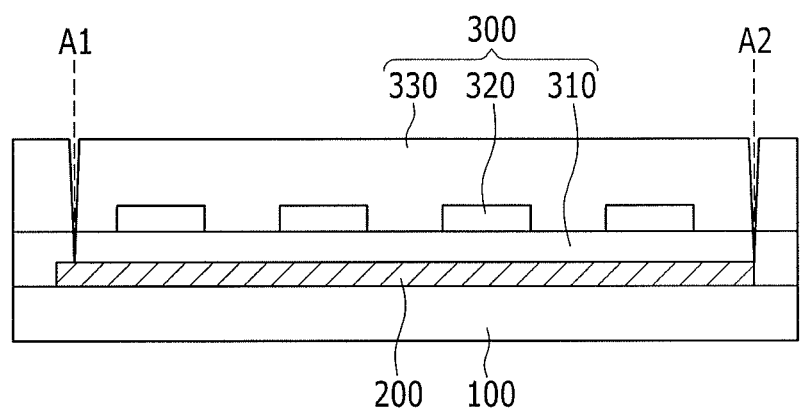
FIG. 2 to FIG. 7 illustrate views sequentially showing a manufacturing method of a flexible display device according to an exemplary embodiment.
Figure 8:
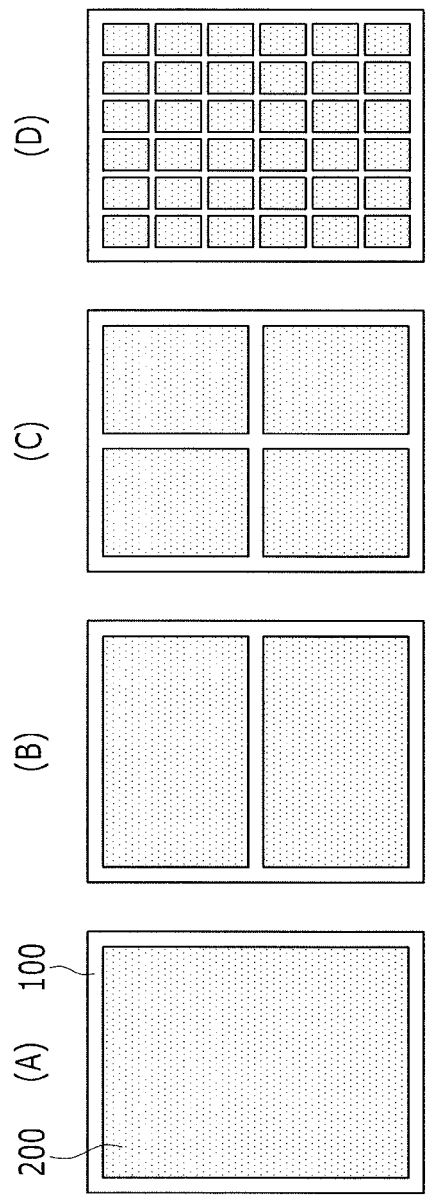
FIG. 8 illustrates an example of a separate layer of various sizes formed on a supporting substrate.

Next, as shown in FIG. 2, after forming the display panel on the separation layer 200, the display panel 300 may be cut into a square or rectangular shape. For example, the display panel 300 may be cut such that four incision surfaces of an appropriate size are formed (see FIG. 8). The cut shape of the display panel 300 is not limited to the square or rectangular shape, and the display panel 300 may be cut into various suitable shapes.

The display panel 300 may be cut in a lower or downward direction from an upper side of the display panel 300. For example, as shown in FIG. 2, by using a substrate cutting apparatus such as a scribing wheel, the display panel 300 may be cut according to cutting lines A1 and A2.

In this case, the scribing wheel may only cut the display panel 300 and may not cut the separation layer 200. For example, the scribing wheel may only cut the display panel 300 contacting the separation layer 200.

Figure 3:
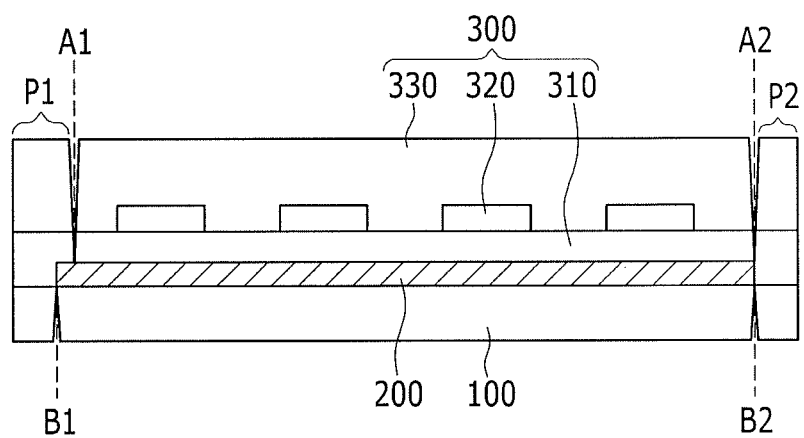

Next, as shown in FIG. 3, the supporting substrate 100 and the separation layer 200 may be cut from a lower side in an upper or upward direction. At this time, the supporting substrate 100 and the separation layer 200 may be cut with a larger square or rectangular shape than an area that the display panel 300 contacts. For example, the supporting substrate 100 and the separation layer 200 may be cut into a rectangular shape that has a larger area than the rectangular shape of the cut display panel 300.

For example, at least one first incision surface of the display panel 300 that is cut with the square or rectangular shape and a first incision surface of the separation layer 200 and the supporting substrate 100 corresponding to the first incision surface of the display panel 300 may have a step. In other words, the cuts may be offset from one another to be unaligned, e.g., the cuts may not line up with one another. Here, the first incision surface of the display panel 300 means a surface that is cut according to the cutting line A1 in FIG. 1, and the first incision surface of the separation layer 200 and the supporting substrate 100 means a surface that is cut according to the cutting line B1.

Also, another incision surface (i.e., except for or different from the at least one first incision surface of the display panel 300) may be cut parallel to and aligned with another incision surface (i.e., except for or different from the first incision surface of the separation layer 200 and the supporting substrate 100).

For example, as shown in FIG. 1, the cutting line B1 (formed by the first incision surface of the supporting substrate 100 and the separation layer 200) may be cut to be positioned outside the cutting line A1 (formed by the first incision surface of the display panel 300 by a length G in a horizontal direction). If the supporting substrate 100 and the separation layer 200 are cut as described above, the cut supporting substrate 100 and the cut separation layer 200 may have the square or rectangular shape having the larger area than the cut display panel 300.

Referring to FIG. 1, a separation distance G of the cutting line A1 from the cutting line B1 may be about 0.5 to about 3 mm. In an implementation, the separation distance G may be about 1 to about 2 mm. Maintaining the separation distance G at about 3 mm or less may help prevent damage to the separation layer 200 and the supporting substrate 100 in a subsequent peeling step. Also, maintaining the separation distance G at about 0.5 mm or greater may help facilitate insertion of a peeler R, that will be described below.

Further, the scribing wheel of the substrate cutting apparatus may cut both the supporting substrate 100 and the separation layer 200. For example, the scribing wheel may cut the separation layer 200 in the upper or upward direction from the lower side to the upper surface of the separation layer 200.

Next, portions of the display panel, supporting substrate, and separation layers P1 and P2 around the display panel 300, the supporting substrate 100, and the separate layer 200 (that are cut in the square or rectangular shape) may be separated.

When cutting the supporting substrate 100 and the separation layer 200 from the lower side in the upper or upward direction by using the scribing wheel, in the case that the portions of the display panel, the supporting substrate, and the separation layers P1 and P2 are simultaneously separated, the step of separating the surrounding display panel, the supporting substrate, and the separation layers P1 and P2 may not be performed.

If the surrounding display panel, the surrounding supporting substrate, and the surrounding separation layers P1 and P2 remain, an external force may be applied to the surrounding display panel, the surrounding supporting substrate, and the surrounding separation layers P1 and P2 to detach them.

When cutting the supporting substrate 100 and the separation layer 200 from the lower side in the upper or upward direction, as shown in FIG. 3, the portion P1 where the incision surfaces do not accord or align may be weakly adhered to the separation layer 200.

Figure 4:
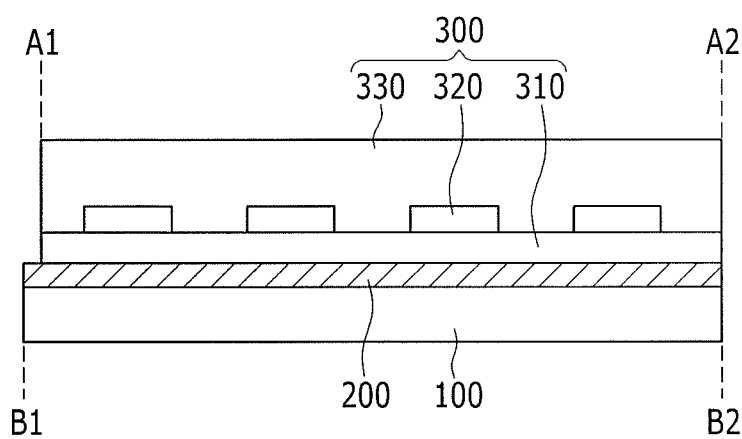

If the surrounding display panel, the surrounding supporting substrate, and the surrounding separation layers P1 and P2 are detached by the external force, the supporting substrate 100, the separation layer 200, and the display panel 300 may be formed with the shape shown in FIG. 4.

Next, the separation layer 200 and the display panel 300 may be separated from each other.

Figure 5:
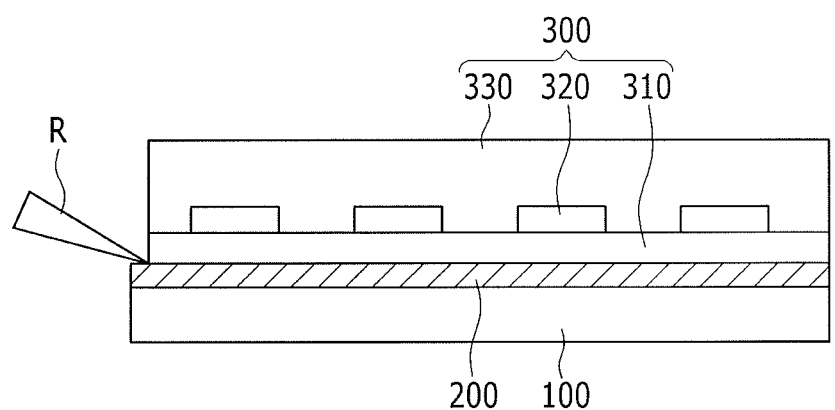
Figure 6:
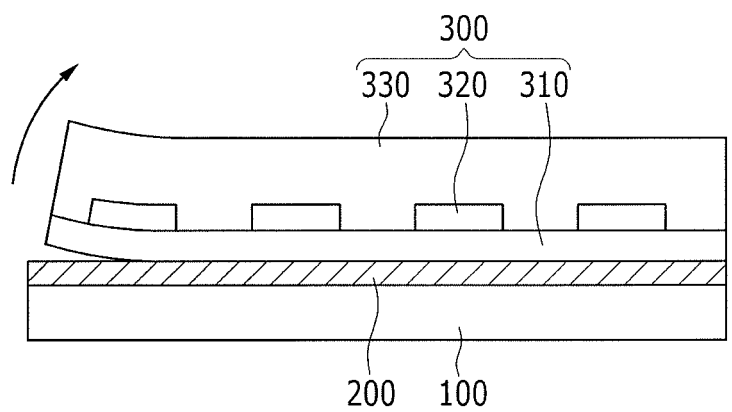

Referring to FIG. 5 and FIG. 6, the step of separating the separation layer 200 and the display panel 300 from each other may include a step of peeling between the side end of the first incision surface of the stepped display panel 300 and the separation layer 200.

For example, as shown in FIG. 5, the peeling may be firstly performed between the stepped separation layer 200 and the side end of the first incision surface of the display panel 300.

The peeler R may be used to peel between the separation layer 200 and the side end of the first incision surface of the display panel 300. The peeler R may be made with a thin plate shape having a width corresponding to a width of the display panel 300.

The peeler R with the thin plate shape may be inserted between the separation layer 200 and the side end of the first incision surface of the display panel 300 to physically peel the side end of the first incision surface of the display panel 300 from the separation layer 200 with the stepped shape.

According to an exemplary embodiment, as shown in FIG. 5, by peeling the ends of the display panel 300 and the separation layer 200 where the first incision surface of the separation layer 200 and the first incision surface of the display panel 300 are stepped, the inferiority rate generated in the peeling may be reduced.

However, if the incision surfaces of the separation layer 200 and the display panel 300 were parallel to and aligned with each other, if the peeler R is used, the thickness of the peeler R may be larger than the thickness of the display panel 300, the separation layer 200, or the supporting substrate 100 such that the display panel 300, the separation layer 200, or the supporting substrate 100 may be broken or damaged.

Next, by relatively moving the peeled side end of the first incision surface of the display panel 300 and the peeled separation layer 200 in a direction away from each other, the display panel 300 and the separation layer 200 and supporting substrate 100 may be separated.

Figure 7:
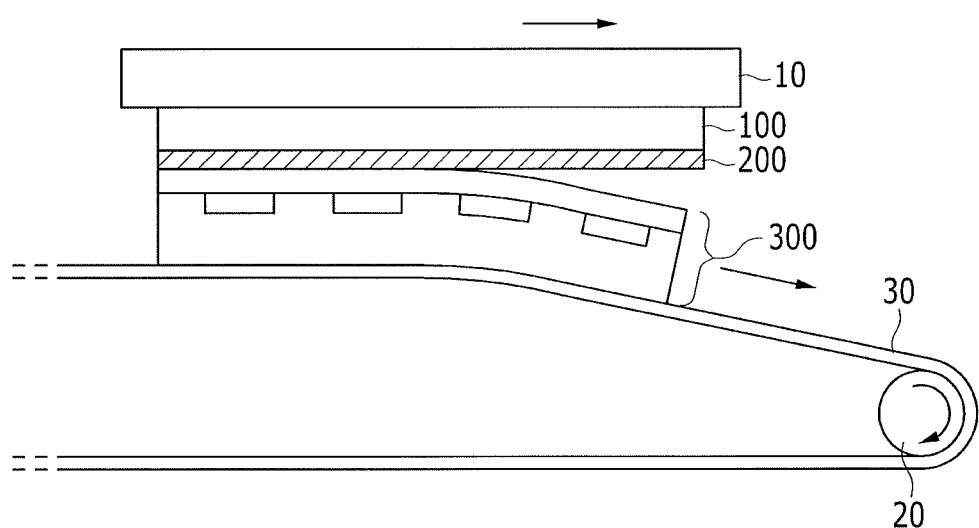

For example, as shown in FIG. 7, in the separation step of relatively moving the display panel 300 and the separation layer 200 and supporting substrate 100 apart, a step of fixing an outer surface of the supporting substrate 100 and an outer surface of the display panel 300 to a first fixing part 10 and a second fixing part 30, respectively, may be firstly performed.

At this time, the outer surface of the supporting substrate 100 and the outer surface of the display panel 300 may be fixed to the first fixing part 10 and the second fixing part 30, respectively, by a vacuum absorption method.

Also, by operating the first fixing part 10 and the second fixing part 30, the separation layer 200 may be gradually separated from the side end of the first incision surface of the peeled display panel 300.

By operating the first and second fixing parts 10 and 30, the separation layer 200 and the display panel 300 may be gradually separated.

The first fixing part 10 (to which the outer surface of the supporting substrate 100 is fixed) may be a first conveyor belt that is extended in a horizontal direction. Also, the second fixing part 30 (to which the outer surface of the display panel 300 is fixed) may be a second conveyor belt having a portion that is partially extended in the horizontal direction, as shown in FIG. 7, and a remaining portion that is extended in an inclined direction.

For example, as shown in FIG. 7, the supporting substrate 100 may be moved in the horizontal direction by the first fixing part 10, and the display panel 300 may be obliquely moved in the inclined direction by the second fixing part 30 such that the separation layer 200 and the display panel 300 may be gradually separated.

The manufacturing method of the flexible display device according to an exemplary embodiment may cut one incision surface of the incision surfaces of the display panel and the supporting substrate that are cut with the square shape to have the step, such that breakage and damage to the display panel (which may otherwise be generated when separating the supporting substrate and the display panel) may be prevented.

By way of summation and review, in the flexible display device, the flexible substrate may be formed on a supporting substrate that is solid, and the display panel may be deposited on the flexible substrate. This is because the flexible substrate may be weak such that it may be damaged in the manufacturing process.

Accordingly, the flexible substrate may need to be separated from the supporting substrate after forming the display panel on the flexible substrate. However, the flexible substrate or the display panel may be damaged in this process.

According to the manufacturing method of the flexible display device, in the manufacturing process of the flexible display device, when separating the flexible substrate and the display panel from the supporting substrate, breakage and damage of the flexible substrate and the display panel may be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 100: supporting substrate | 200: separate layer |
| 310: display substrate | 320: organic light emitting element |
| 330: thin film encapsulation layer | |

What is claimed is:

1. A method of manufacturing a flexible display device, the method comprising:
   depositing a separation layer on a supporting substrate;
   depositing a display panel on the separation layer;
   cutting the display panel to have a predetermined shape;
   cutting the supporting substrate and the separation layer to have a wider area than an area where the display panel, that is cut with the predetermined shape, contacts the supporting substrate and the separation layer; and
   separating the separation layer and the display panel from each other.

2. The method of claim 1, wherein:
   cutting the display panel includes cutting the display panel from an upper side of the display panel in a downward direction,
   cutting the supporting substrate and the separation layer includes cutting the supporting substrate and the separation layer from a lower side of the supporting substrate in an upward direction.

3. The method of claim 1, wherein
   the predetermined shape in which the display panel is cut is a rectangular shape, and
   cutting the supporting substrate and the separation layer includes cutting the separation layer and the supporting substrate to have a rectangular shape corresponding to the rectangular shape of the display panel.

4. The method of claim 3, wherein at least one first incision surface of the display panel having the rectangular shape and a first incision surface of the separation layer and the supporting substrate, corresponding to the first incision surface, are stepped relative to one another.

5. The method of claim 4, wherein another incision surface, different from the at least one first incision surface of the display panel, is parallel to and aligned with another incision surface of the separation layer and the supporting substrate, different from the first incision surface of the separation layer and the supporting substrate.

6. The method of claim 1, further comprising, before separating the separation layer and the display panel, separating the display panel, the supporting substrate, and the separation layer around the display panel, the supporting substrate, and the separation layer that are cut with the predetermined shape from the display panel, the supporting substrate, and the separation layer that are cut with the predetermined shape.

7. The method of claim 4, wherein separating the separation layer and the display panel includes peeling between a side end of the first incision surface of the display panel and the first incision surface of the separation layer that are stepped relative to one another.

8. The method of claim 7, wherein, in the peeling of the side end of the first incision surface of the display panel and the separation layer that are stepped relative to one another, the side end of the first incision surface of the display panel and the separation layer that are stepped relative to one another are physically peeled by inserting a peeler between the side end of the first incision surface of the display panel and the separation layer that are stepped relative to one another.

9. The method of claim 8, wherein the peeler has a thin plate shape having a width corresponding to a width of the display panel.

10. The method of claim 8, wherein, after peeling the side end of the first incision surface and the separation layer, the display panel and the separation layer are separated from each other by relatively moving the side end of the first incision surface of the display panel and the separation layer in a direction away from each other.

11. The method of claim 10, wherein separating the display panel from the separation layer and the supporting substrate includes:
   respectively fixing an outer surface of the supporting substrate and an outer surface of the display panel to first and second fixing parts, respectively, that are separated from each other; and
   operating the first and second fixing parts to gradually separate the separation layer from the side end of the first incision surface of the peeled display panel in a state in which the outer surface of the supporting substrate and the outer surface of the display panel are respectively fixed to the first and second fixing parts.

12. The method of claim 11, wherein:
   the first fixing part includes a first conveyor belt extended in a horizontal direction; and
   the second fixing part includes a second conveyor belt having a portion that is extended in the horizontal direction and a remaining portion that is extended in an inclined direction.

13. The method of claim 4, wherein a separation distance in the horizontal direction between the first incision surface of the display panel and the first incision surface of the separation layer is about 0.5 mm to about 3 mm.

14. The method of claim 1, wherein the separation layer is formed of aluminum zinc oxide.

15. The method of claim 1, wherein a thickness of the separation layer is about 50 Å to about 300 Å.

16. The method of claim 1, wherein a surface roughness of the separation layer is about 6 Å to about 15 Å.

17. The method of claim 1, wherein the display panel includes:
   a display substrate on the separation layer,
   an organic light emitting element on the display substrate, and
   a thin film encapsulation layer covering the organic light emitting element.

* * * * *